United States Patent
Qiu

(10) Patent No.: US 7,180,066 B2
(45) Date of Patent: Feb. 20, 2007

(54) INFRARED DETECTOR COMPOSED OF GROUP III-V NITRIDES

(76) Inventor: Chang-Hua Qiu, 1 Serina Dr., Plainsboro, NJ (US) 08536

( * ) Notice: Subject to any disclaimer, the term of this patent is extended or adjusted under 35 U.S.C. 154(b) by 154 days.

(21) Appl. No.: 10/996,766

(22) Filed: Nov. 24, 2004

(65) Prior Publication Data

US 2006/0108528 A1   May 25, 2006

(51) Int. Cl.
  *G01J 5/20* (2006.01)
  *H01L 31/0304* (2006.01)
  *H01L 25/065* (2006.01)
  *H01L 27/146* (2006.01)

(52) U.S. Cl. ............ 250/338.4; 250/370.08; 250/370.14; 257/21; 257/22; 977/759; 977/816; 977/954

(58) Field of Classification Search ........ 250/338.4
See application file for complete search history.

(56) References Cited

U.S. PATENT DOCUMENTS

| | | | |
|---|---|---|---|
| 4,894,526 A | 1/1990 | Bethea et al. | |
| 4,903,101 A | 2/1990 | Maserjian | |
| 5,077,593 A | 12/1991 | Sato et al. | |
| 5,198,682 A | 3/1993 | Wu et al. | |
| 5,384,469 A | 1/1995 | Choi | |
| 5,481,397 A * | 1/1996 | Burt | 359/298 |
| 5,895,930 A * | 4/1999 | Oh et al. | 257/21 |
| 6,211,529 B1 | 4/2001 | Gunapala et al. | |
| 6,239,449 B1 * | 5/2001 | Fafard et al. | 257/21 |
| 6,495,852 B1 * | 12/2002 | Mouri | 257/21 |
| 6,559,471 B2 | 5/2003 | Finder et al. | |
| 6,593,589 B1 * | 7/2003 | Osinski et al. | 257/22 |
| 6,605,485 B2 * | 8/2003 | Razeghi | 438/29 |
| 6,734,452 B2 | 5/2004 | Gunapala et al. | |
| 6,864,552 B2 * | 3/2005 | Razeghi | 257/432 |
| 6,946,683 B2 * | 9/2005 | Sano et al. | 257/79 |
| 7,026,641 B2 * | 4/2006 | Mohseni et al. | 257/14 |
| 2004/0135222 A1 * | 7/2004 | Alfano et al. | 257/458 |

FOREIGN PATENT DOCUMENTS

EP   540235 A2 *   5/1993

OTHER PUBLICATIONS

Gunapala et al. "Quantum Well Infrared Photodetector (QWIP) Focal Plane Arrays", Semiconductors and Semimetals Series, vol. 62 (1999), pp. 1-10 and 47-54 [online], [retrieved on Jun. 21, 2006]. Retrieved from the Internet <URL:http://qwip.jpl.nasa.gov/rev.pdf>.*

* cited by examiner

Primary Examiner—David Porta
Assistant Examiner—Frederick F. Rosenberger
(74) Attorney, Agent, or Firm—Michael Crilly, Esq.

(57) ABSTRACT

A quantum-well infrared photodetector (QWIP) is presented. The photodetector includes a substrate, a buffer layer, a first conductive layer, a multiple quantum well, an optional blocking layer, and a second conductive layer. Substrate is composed of a monocrystal which may be removed after fabrication. Remaining layers are composed of group III-V nitrides, including binary, ternary, and quaternary compositions. Alternate embodiments of the present invention include a doped binary alloy along first and second conductive layers, a binary alloy along buffer and blocking layers, and alternating alloys of binary, ternary and quaternary compositions within the multiple quantum well. The present invention responds to infrared light at normal and oblique incidences, from near infrared to very far infrared.

20 Claims, 3 Drawing Sheets

INFRARED DETECTOR COMPOSED OF GROUP III-V NITRIDES

FEDERALLY SPONSORED RESEARCH OR DEVELOPMENT

This invention was made in part with Government support under Contract No. DMI-0318901 awarded by the National Science Foundation and Contract No. HQ0006-03-C-0085 awarded by the Missile Defense Agency. The Government has certain rights in the invention.

CROSS REFERENCE TO RELATED APPLICATIONS

None.

BACKGROUND OF THE INVENTION

1. Field of the Invention

The present invention generally relates to an infrared detector having photocurrent responses from near infrared to very long wavelength infrared at normal and oblique incidences. Specifically, the invention is a quantum-well infrared photodetector composed of group III-V nitrides.

2. Description of the Related Art

Infrared detectors are found in a wide variety of imaging applications, including night vision goggles, surveillance satellites, and seekers. Technical advances continue to increase the resolution and range of infrared systems and to lower their operational costs.

Second-generation infrared systems include two-dimensional focal plane arrays functioning as either photon or heat detectors. Photon detector systems include mercury cadmium telluride (MCT) elements in a pixelized arrangement so as to detect long-wavelength infrared (LWIR, 8–12 μm), and MCT and indium antimonide (InSb) elements in a pixelized arrangement so as to detect medium-wavelength infrared (MWIR 3–5 μm). Heat or thermal detectors include microbolometers and pyroelectric sensors. Such devices do not require cooling and therefore are lighter and less expensive than photon detectors. However, microbolometers and pyroelectric sensors are resolution and range limited.

Third-generation infrared systems are separable into three distinct design approaches, namely, large format two-dimensional focal plane arrays, multi-spectral detection and correlation at two or more wavelengths, and longer wavelength sensing.

Exemplary third generation detectors include multi-spectral MCT, antimonide-based devices, and quantum-well infrared photodetectors (QWIPs). MCT technology has been demonstrated in focal plane arrays having as many as four million pixels sensing infrared wavelengths up to 17 μm. However, large format focal plane arrays suffer uniformity and operability problems in the range of LWIR. Theoretically, antimonide-based devices are wavelength tunable and capable of quantum efficiencies exceeding 80%. However, material and surface problems limit detector performance in practical applications. QWIPs facilitate large format focal plane arrays and multiple spectral detection in the range of MWIR and LWIR. However, arsenide-based devices, such as those described and claimed by Gunapala et al. in U.S. Pat. Nos. 6,734,452 B2 and 6,211,529 B1, have a low quantum efficiency (10–20%), require cooling, and fail to detect infrared around 37 μm.

Both second and third generation devices are unable to absorb normal incident light. Gratings and beveled edges are employed to correct this deficiency. However, both approaches increase complexity and cost and degrade performance by increasing crosstalk.

While nitride-based compositions have been applied to multiple quantum wells in light emitting diodes and lasers, application to far infrared detectors is not found in the related arts. Furthermore, quantum well structures within diodes and lasers are simply too conductive for far infrared detection. For example, a quantum well within a typical diode or laser has an electron concentration exceeding $10^{18}$ $cm^{-3}$, thereby reflecting infrared light at wavelengths above 33 μm. Since wavelengths as high as 100 μm are needed for some far infrared detector applications, it is desired to have a free electron concentration less than $10^{18}$ $cm^{-3}$.

What is currently required is an infrared detector with improved sensitivity and capable of operating at higher temperatures so as to extend the operational range of imaging systems.

SUMMARY OF THE INVENTION

An object of the present invention is to provide a quantum-well infrared photodetector with improved sensitivity.

Another object of the present invention is to provide a quantum-well infrared photodetector capable of detecting long-wavelength infrared.

Another object of the present invention is to provide a quantum-well infrared photodetector having a lower cost as compared to arsenide-based devices.

The present invention includes a substrate, a buffer layer, a first conductive layer, a multiple quantum well, an optional blocking layer, and a second conductive layer. Substrate is composed of a monocrystal oxide or carbide, examples including sapphire ($Al_2O_3$) and silicon carbide (SiC), respectively. Substrate may be removed after fabrication. Remaining layers are composed of group III-V nitride compounds. First and second conductive layers are electrically connected to a current sensing device.

Group III-V nitrides are comprised of elements selected from group III, namely, aluminum (Al), gallium (Ga), and indium (In) and the group V element nitrogen (N). Nitride-based compositions include binary alloys, examples including gallium nitride (GaN) and aluminum nitride (AlN), ternary alloys, examples including aluminum gallium nitride (AlGaN) and indium gallium nitride (InGaN), and quaternary alloys, an example being aluminum indium gallium nitride (AlInGaN). Group III-V nitrides have a wide band gap range so as to cover a wavelength band from visible to ultraviolet light.

Alternate embodiments of the present invention include a doped binary alloy along first and second conductive layers and/or wells, a binary or ternary alloy along buffer layer, and alternating layers of binary, ternary and quaternary alloys within the multiple quantum well.

Several advantages are offered by the present invention.

First, the invention increases the electron effective mass thereby reducing leakage current. Current leakage has two primary sources, namely, thermionic emissions (TE), resulting from the direct excitation of electrons to the continuum band, and field-induced emissions (FIE), due to thermally assisted tunneling. TE leakage is reduced as it is inversely related to electron effective mass. Likewise, FIE leakage is reduced since tunneling probability is proportional to $\exp[-A(m^*)^{1/2}]$, where A is a constant related to barrier height and electric field and $m^*$ is the electron effective mass.

Second, the invention minimizes effects of dislocations and interfaces thereby achieving a higher quantum efficiency-mobility-lifetime product (ημτ product) than group IV, non-nitride group III-V, group II-IV and telluride-based compositions. Group III-V nitrides achieve a ημτ product in the range of $10^{-1}$ to 10 cm$^2$/V.

Third, the invention responds to normally incident infrared light.

Fourth, the invention functions in the broad wavelength window from 2 μm to over 80 μm.

Fifth, the invention is easier to manufacture and process as compared to compositions including arsenic, mercury, and cadmium, and more environmentally friendly.

Sixth, the invention achieves a higher signal-to-noise ratio than similar infrared sensors.

BRIEF DESCRIPTION OF THE DRAWINGS

Details of the present invention are described in connection with the accompanying drawings, in which.

REFERENCE NUMERALS

Figure 1:
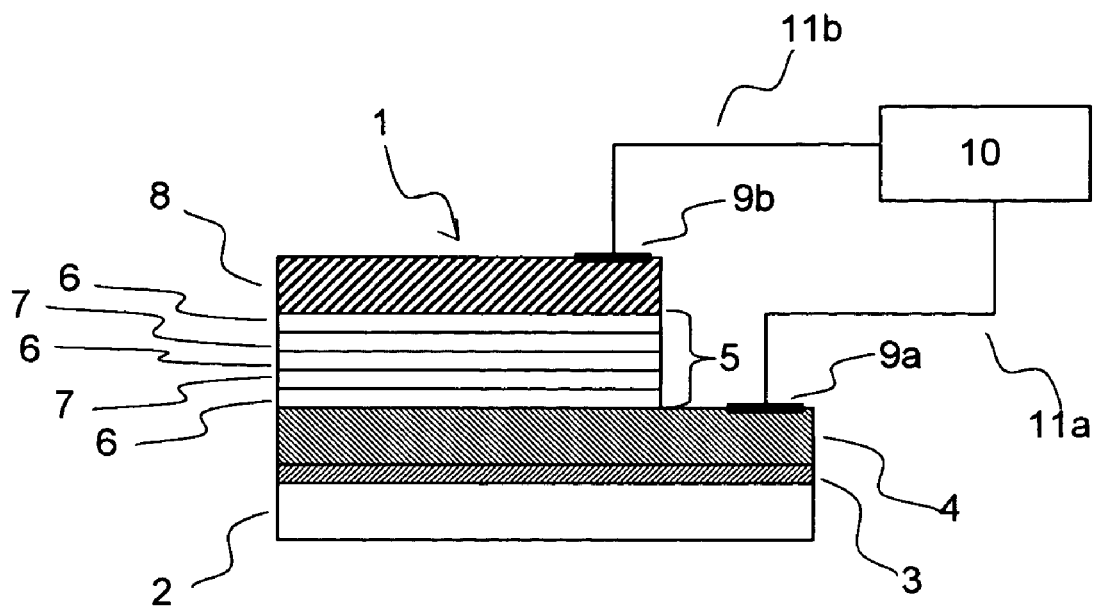
FIG. 1 is a schematic diagram of the present invention showing a single quantum-well infrared photodetector.

1 Detector
2 Substrate
3 Buffer layer
4 First conducting layer
5 Multiple quantum well
6 Barrier
7 Well
8 Second conducting layer
9a–9b Contact
10 Current sensing device
11a–11b Lead
12 Blocking layer
21 Focal plane array
22 Detector
23 Row
24 Column
25 Height
26 Width

DESCRIPTION OF THE INVENTION

Figure 2:
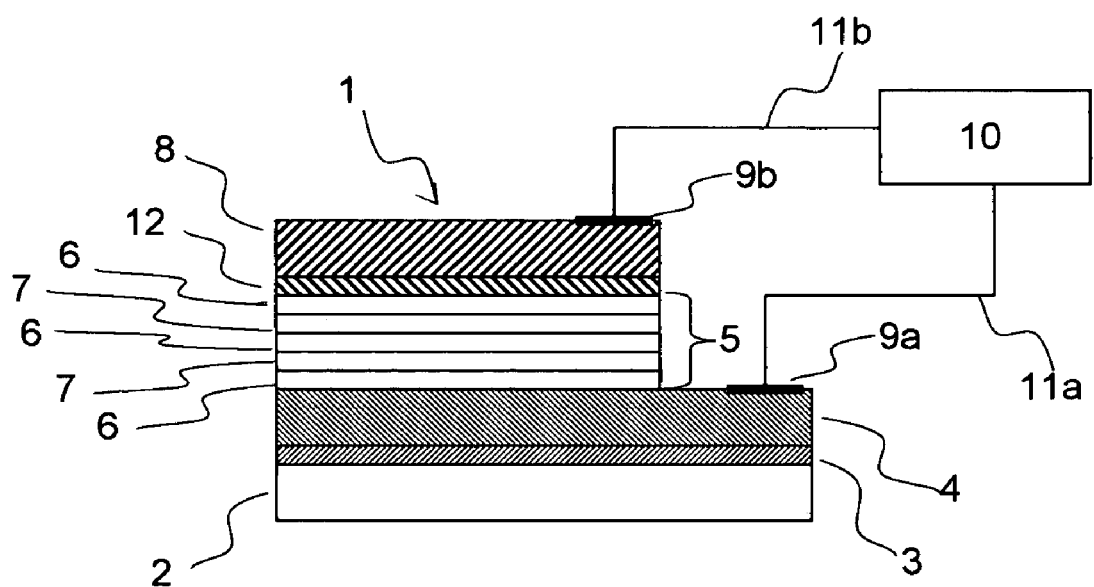
FIG. 2 is a schematic diagram of the present invention showing a single quantum-well infrared photodetector with optional blocking layer between second conducting layer and multiple quantum well.
Figure 3:
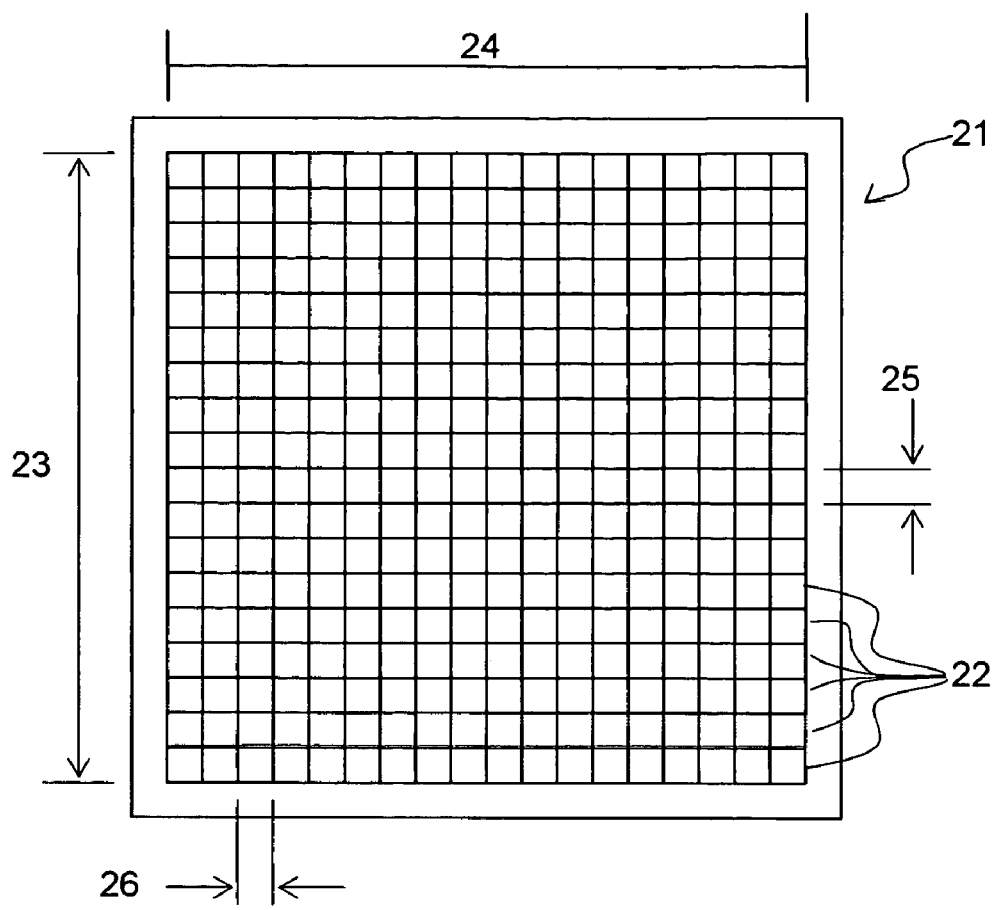
FIG. 3 is a schematic diagram of a focal plane array composed of a plurality of quantum-well infrared photodetectors.
Figure 4:
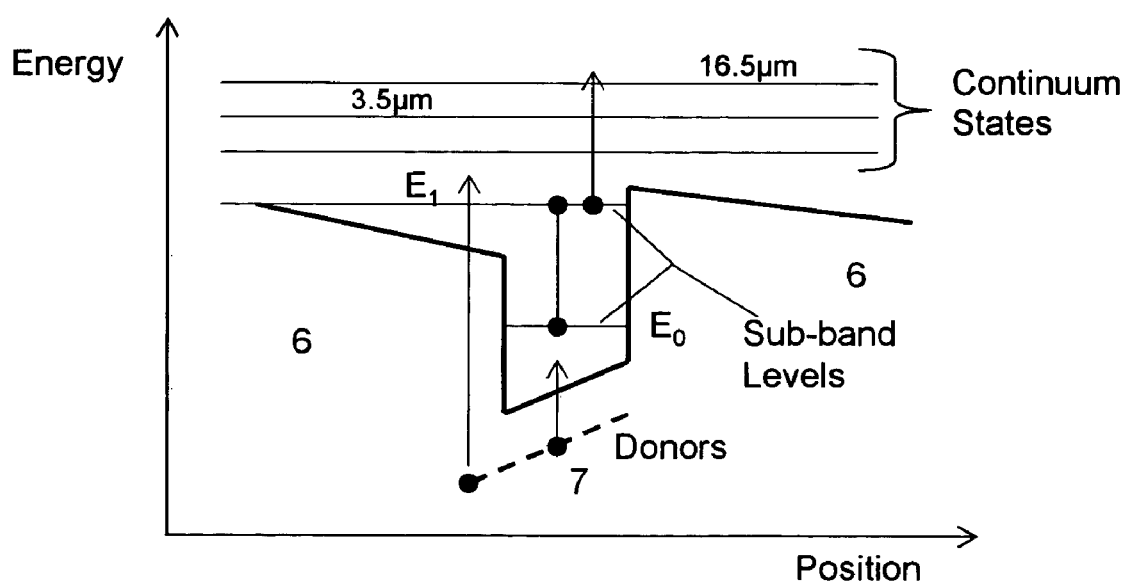
FIG. 4 is a schematic diagram describing the operational principle of a quantum-well infrared photodetector.
Figure 5:
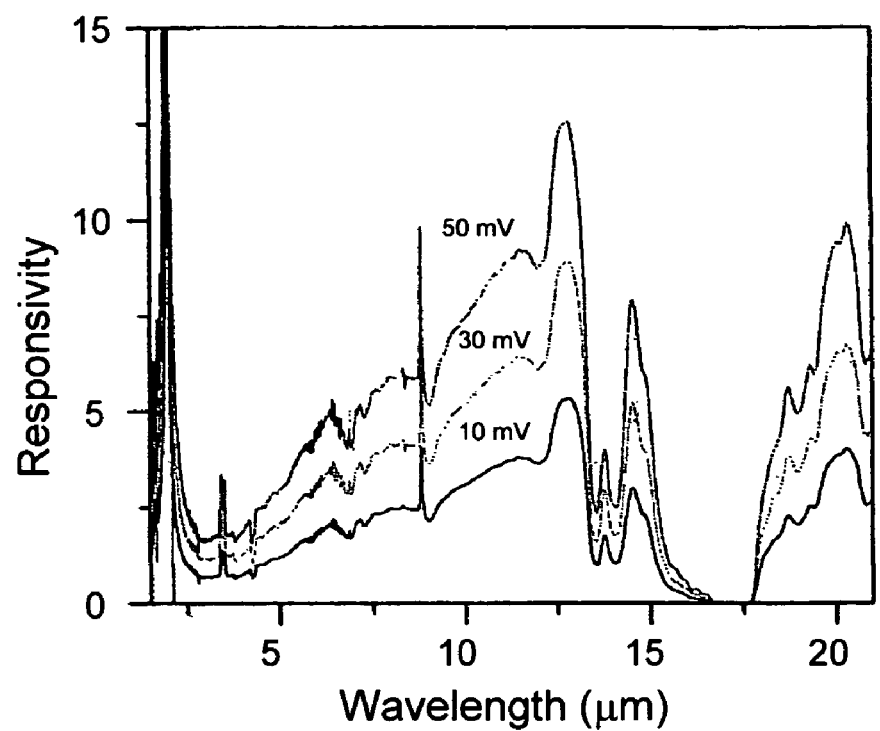
FIG. 5 is an example chart of responsivity versus wavelength showing photocurrent response of a quantum-well infrared photodetector for short to long wavelength infrared at normal incidence.
Figure 6:
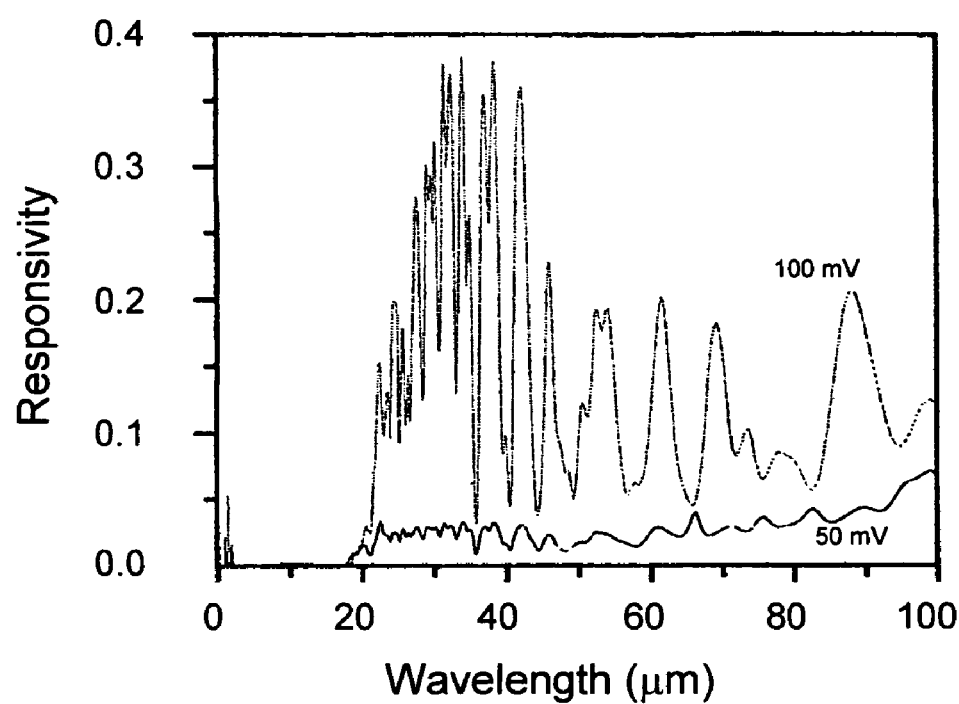
FIG. 6 is an example chart of responsivity versus wavelength showing photocurrent response of a quantum-well infrared photodetector for very long wavelength infrared at normal incidence.

FIGS. 1 and 2 describe exemplary embodiments of the present invention. FIG. 3 describes the application of detectors 1 in FIGS. 1 and 2 to a focal plane array 21. FIG. 4 graphically represents the functional performance of devices shown in FIGS. 1 and 2. FIGS. 5 and 6 describe the performance of the present invention at near to long and very long wavelengths, respectively. Drawings are not to scale.

Referring now to FIG. 1, a detector 1 is shown having a substrate 2, a buffer layer 3, a first conducting layer 4, a multiple quantum well 5, and a second conducting layer 8. Layers are contacting and attached in the order described. Conductive contacts 9a and 9b are provided along one surface of the first conducting layer 4 and second conducting layer 8, respectively. Each contact 9a and 9b is thereafter electrically connected to a lead 11a and 11b, respectively. Leads 11a and 11b are electrically connected to a current sensing device 10. Leads 11a, 11b and current sensing device 10 include elements understood in the art.

Referring now to FIG. 2, the detector 1 is shown having a blocking layer 12 between, contacting, and attached to the second conducting layer 8 and multiple quantum well 5. The blocking layer 12 can be used to further optimize the signal from the detector 1.

The multiple quantum well 5 is composed of barriers 6 and wells 7 arranged in a layered fashion, as shown in FIGS. 1 and 2. Layers are contacting and attached. The number of wells 7 or periods within a design is performance and application dependent. Although more periods are generally desired, too many may induce structural disorder within the multiple quantum well 5. As such, it was preferred to have no more than 100 wells 5 because of the limitations inherent to presently known deposition technologies. However, it is recognized that more wells 5 may be possible as such technologies mature.

The thickness of barriers 6 and wells 7 is likewise performance dependent. In general, the heavier electron effective mass of group III-V nitrides allows for thinner barriers 6 as compared to those described in the art. For example, a barrier 6 having a thickness up to 100 nm was adequate for many applications. Preferred embodiments favored a thickness from 15 nm to 40 nm so as to minimize material and growth time and to approximate the tunneling probability of gallium arsenide (GaAs) at a thickness greater than 40 nm. A well 7 having a thickness from 1 nm to 10 nm was likewise adequate for many applications. However, it was preferred to have a well 7 with thickness from 3 nm to 6 nm and a barrier height of 300 meV or less for long infrared detection applications.

TABLE 1 identifies materials applicable to the various layers within embodiments in FIGS. 1 and 2.

TABLE 1

| Layer | Composition | Preferred |
| --- | --- | --- |
| Substrate (2) | Oxides | Sapphire |
|  | Carbides | SiC |
|  | Binary III–V nitrides | GaN |
| Buffer layer (3) | Binary III–V nitrides |  |
|  | Ternary III–V nitrides |  |
| First conducting layer (4) | Binary III–V nitrides | Doped GaN |
|  | Ternary III–V nitrides |  |
|  | Quaternary III–V nitrides |  |
| Multiple quantum well (5) | Binary/Binary III–V nitrides |  |
|  | Ternary/Ternary III–V nitrides |  |
|  | Quaternary/Quaternary III–V nitrides |  |
|  | Binary/Ternary III–V nitrides |  |
|  | Ternary/Quaternary III–V nitrides |  |
|  | Binary/Quaternary III–V nitrides |  |
|  | Ternary/Binary III–V nitrides |  |
|  | Quaternary/Ternary III–V nitrides |  |
|  | Quaternary/Binary III–V nitrides |  |
| Barrier (6) | Binary III–V nitrides | GaN |
|  | Ternary III–V nitrides | AlGaN |
|  | Quaternary III–V nitrides | $Al_xIn_yGa_{1-x-y}N$ |

TABLE 1-continued

| Layer | Composition | Preferred |
|---|---|---|
| Well (7) | Binary III–V nitrides | GaN |
| | Ternary III–V nitrides | InGaN |
| | Quaternary III–V nitrides | $Al_xIn_yGa_{1-x-y}N$ |
| Second conducting layer (8) | Binary III–V nitrides | Doped GaN |
| | Ternary III–V nitrides | |
| | Quaternary III–V nitrides | |
| Blocking layer (12) | Binary III–V nitrides | GaN |
| | Ternary III–V nitrides | AlGaN |
| | Quaternary III–V nitrides | |

TABLE 2 summarizes exemplary thickness ranges and electron concentrations for each layer. Specified thickness values are not limiting and highly design and performance dependent.

TABLE 2

| Layer | Thickness (nm) | Typical Electron Concentration |
|---|---|---|
| Substrate (2) | $\leq 7{,}000$ | |
| Buffer layer (3) | $\leq 100$ | |
| First conducting layer (4) | $\leq 3{,}000$ | $\geq 10^{18}$ cm$^{-3}$ |
| Barrier (6) | $\leq 100$ | $< 1 \times 10^{17}$ cm$^{-3}$ |
| Well (7) | $\leq 10$ | $> 1 \times 10^{17}$ cm$^{-3}$ |
| Second conducting layer (8) | $\leq 3{,}000$ | $\geq 10^{18}$ cm$^{-3}$ |
| Blocking layer (12) | $\leq 100$ | $\leq 10^{17}$ cm$^{-3}$ |

While a variety of known manufacturing methods are applicable to fabricating the detector 1, it was preferred to use a metal oxide chemical vapor deposition (MOCVD) process for the epitaxial growth of nitride-based materials.

The process described below was employed to establish quality of growth, $\eta\mu\tau$ product, electron mobility and concentration, and growth and etch rates. While specific materials are referenced, the described method is applicable to other material systems in TABLE 1.

Substrate 2 is comprised of a composition capable of nitride growth. While a variety of compositions are known and used within the art, it was preferred for the substrate 2 to have a monocrystal structure and composed of either an oxide or carbide, examples including $Al_2O_3$ and SiC, respectively. It was likewise possible for the substrate 2 to be a binary group III-V nitride, one example being GaN. Substrates 2 were fabricated via processes known within the art.

Next, a buffer layer 3 composed of undoped GaN or InGaN or AlN was grown onto the substrate 2. Undoped GaN was applied via a MOCVD process including ammonia and TMG using parameters and procedures understood in the art. Undoped InGaN was applied via a MOCVD process including ammonia, TMG, and thimethylindium (TMI), also using parameters and procedures understood in the art. For example, a 20 nm thick buffer layer 3 of GaN or InGaN or AlN was achieved by the steps including high temperature (1030° C.) anneal in ammonia and layer growth at low temperature (550° C.).

Next, a first conducting layer 4 was grown onto the buffer layer 3. For example, a 2,000 nm thick layer of GaN was grown onto the surface of the buffer layer 3 opposite the substrate 2 at a temperature of 1030° C. It was preferred to have the first conducting layer 4 doped with silicon so as to have an electron concentration (EC) of at least $10^{18}$ cm$^{-3}$. Ohmic contact to the multiple quantum well 5 was provided through the first conducting layer 4. The first conducting layer 4 may also function as a reflection mirror for long wavelength infrared so as to increase response of the detector 1.

Next, the growth temperature was lowered to the range of 750° C. to 800° C. for growth of barriers 6 and wells 7 within the multiple quantum well 5. The multiple quantum well 5 was fabricated via the sequential and separate growth of barrier 6 and well 7 layers. While a wide thickness range is possible for barriers 6 and wells 7, it was preferred to have a barrier 6 with a thickness less than 100 nm and a well 7 with a thickness no greater than 10 nm. For example, multiple quantum wells 5 having a total thickness from 200 nm to 500 nm were demonstrated composed of InGaN wells 7 each having a thickness of 3 nm to 6 nm and GaN barriers 6 each having a thickness of 15 nm to 40 nm.

Films were examined for electrical and photoluminescence via techniques understood in the art. For example, photoluminescence measurements quantified band edge luminescence, Hall Effect measurements quantified electron mobility and concentration, and x-ray diffraction (XRD) qualified the microstructure. Films having an electron concentration (EC) greater than $10^{18}$ cm$^{-3}$ were rejected. Band edge luminescence and XRD were used to estimate band gap energy and lattice constants for InGaN films. It was desired for the films to have a high photoconductivity-to-dark-conductivity ratio. Photoconductivity spectra measurements from visible to UV, via methods understood in the art, were used to reveal defect states within band gaps and surface recombinations.

It was preferred for the electron concentration (EC) in wells 7 to exceed that in the barriers 6. For example, typical barriers 6 were undoped and had an electron concentration less than $5 \times 10^{17}$ cm$^{-3}$. In thermal equilibrium, electrons from the GaN barriers 6 are transferred to the InGaN wells 7. Preferred wells 7 had an electron concentration greater than $5 \times 10^{17}$ cm$^{-3}$. Electron concentrations were found to be dependent on the mole fraction of indium, growth temperatures, and relative thickness between wells 7 and barriers 6. In some embodiments, it may be desired to dope the wells 7 with silicon to further increase the electron concentration differential between barriers 6 and wells 7.

Next, a second conducting layer 8 was grown onto the multiple quantum well 5 opposite of the first conducting layer 4. For example, a 150 nm thick layer of GaN was grown onto the surface of the barrier 6 opposite of the substrate 2 at a temperature of 1030° C. It was preferred to have the second conducting layer 8 doped with silicon so as to increase the electron concentration to at least $10^{18}$ cm$^{-3}$. Ohmic contact to the multiple quantum well 5 was provided through the second conducting layer 8.

An optional blocking layer 12 can be used between multiple quantum well 5 and second conducting layer 8 in some embodiments. For example, a 20 nm thick layer of undoped GaN may be grown onto the surface of the multiple quantum well 5 opposite of the first conducting layer 4 at a temperature of 1030° C. Thereafter, a second conducting layer 8 was grown onto the blocking layer 12 via the method described above. Ohmic contact to the multiple quantum well 5 should be maintained between multiple quantum well 5 and second conducting layer 8.

First conducting layer 4, multiple quantum well 5, second conducting layer 8, and optional blocking layer 12 were each inspected by one or more of the methods described above. Photoluminescence measurements were used to quantify band edge luminescence, Hall Effect measurements to quantify electron mobility and concentration, and x-ray diffraction (XRD) to qualitatively assess the microstructure. Band edge luminescence and XRD were used to estimate band gap energy and lattice constants. Photoconductivity spectra measurements from visible to UV, via methods understood in the art, were used to reveal defect states within band gaps and surface recombinations.

Contacts 9a and 9b were provided on first conducting layer 4 and second conducting layer 8, respectively, to facilitate ohmic contact between the mentioned layers and leads 11a and 11b. The surface of both first conducting layer 4 and second conducting layer 8 were etched using reactive ion etching in a chlorine plasma, a method known within the art, to expose the underlying n-type GaN layer. A conductive metal, preferably a double layer gold-titanium film, was thereafter deposited onto the exposed surface via evaporation, also a method understood in the art. Contacts 9a and 9b may be annealed after deposition to improve their contact properties.

The etch process may include photoresist methods understood in the art. For example, a photoresist mask may be applied onto selected surface regions of the second conductive layer 8. Thereafter, a chlorine-based plasma is used to etch the unmasked regions of the GaN to expose an underlying GaN layer. Thereafter, a second mask procedure may be applied to the GaN that later separate top and bottom contact regions. Thereafter, metal is evaporated and deposited onto non-masked and masked regions. A metal lift-off process is then performed so as to leave metal contacts 9a and 9b in the desired locations.

Referring now to FIG. 3, a focal plane array 21 is shown including a plurality of detectors 22 arranged in rows 23 and columns 24 and mounted onto a single wafer. Each detector 22 was preferred to be dimensionally identical so as to have a common height 25 and width 26. It was likewise preferred for detectors 22 to have a height 25 and width 26 at least five times the wavelength to be detected and small as possible so as to maximize their density within an array. For example, a detector 22 having a nominal height 25 and width 26 of 50 µm enabled a pixelized array as large as 512-by-512 detectors 22 on a 50.8 mm diameter wafer.

While detectors 22 may be individually manufactured and thereafter assembled into a focal plane array 21, it was preferred to fabricate large dies, one example being a 50.8 mm wafer with 256-by-512 sensors. Thereafter, the wafer was diced, via a mechanical method understood in the art, to form an individual array.

Indium bumps may be applied to serve as electrical interconnections between detectors 22 and a read-out unit cell (ROIC), one example being an Amber series ROIC, following metallization and dicing steps described above. Indium is preferred since it remains ductile at the temperature of liquid helium and forms a good bond at room temperature. Evaporation and liftoff methods understood in the art are used to fabricate indium bumps. Before evaporation of the indium bump, an under bump metallurgy (UBM) layer is deposited to anchor the indium bump to the lead 9a, 9b. It is desired to achieve a bump having a nearly uniform height. Next, flip-chip bonding using a flip-chip aligner secured the detector 22 to the ROIC. The gap between focal plane array 21 and ROIC is a function of bonding pressure and bump height. Next, an underfill is applied between focal plane array 21 and ROIC to improve the mechanical strength of the now bonded focal plane array 21 and ROIC assembly and to minimize thermal expansion there between. Likewise, underfill protects both focal plane array 21 and ROIC from moisture and other contaminants and may mitigate shock and vibration effects. Thereafter, the substrate 2 is abrasively polished via methods understood in the art. Polishing may remove stresses induced by thermal expansion which accumulate during manufacture. Furthermore, polishing may eliminate optical crosstalk between pixels, and significantly enhance optical coupling of infrared radiation into the detector 22, since a sapphire-based substrate 2 is generally not transparent beyond 7,000 nm. Finally, the focal plane array 21 and ROIC are bonded onto a lead-free ceramic chip carrier (LCCC) via a die-bonding method understood in the art. Input/output metal pads on the ROIC are connected to pins along the LCCC by a wire bonding process, also understood in the art.

Referring now to FIG. 4, a single well 7 is shown between a pair of barriers 6 such that the vertical axis represents energy and the horizontal axis represents position. In principle, electrons within the well 7 have an initial energy, $E_0$, corresponding to a ground state. Electrons within the well 7 are excited to a state having an energy, $E_1$, when infrared light is absorbed by the multiple quantum well 5. Excited electrons contribute to the photocurrent response perpendicular to the plane of the multiple quantum well 5, thus sensing infrared light. Likewise, transitions from donor or defect levels to sub-band levels, or from donor levels to continuum states, or from sub-band levels to continuum states, also contribute to infrared sensing.

The performance of the detector 1 is tailored to the specific application via the composition of layers so as to yield the desired performance. The multiple quantum well 5 is optimized via material composition, element content, and thickness. For example, barriers 6 may be composed of a binary alloy, a ternary alloy, including aluminum gallium nitride (AlGaN), or a quaternary alloy, including indium gallium aluminum nitride (InGaAlN). Aluminum and indium content may be varied to tailor the performance of individual barriers 6. It was preferred for the content of indium not to exceed 20%, on a molar basis. Likewise, wells 7 may be composed of a binary alloy, one example being gallium nitride (GaN), a ternary alloy, one example being InGaN, or a quaternary alloy.

Transition energies ($E_1$–$E_0$) are greatly influenced and controlled by the thickness and height of the barrier 6 and the thickness of the well 7. Each barrier-well pair has a thickness and height at which the first excited state exhibits an energy level just at the top of the barrier 6. The first excited state is no longer a bound state when the quantum well is thin and exhibits energies deep into the well 7 when the quantum well is thick. The latter reduces the probability of tunneling through the barrier 6.

The group III-V nitride AlInGaN possesses a built-in electric field thereby allowing the effective height of the barrier 6 to be lower in multiple quantum wells 5. During electron transfer, wells 7 are generally negatively charged and barriers 6 are positively charged resulting in an electric field pointing from barrier 6 to well 7. The resulting electric potential is lower in the well 7 than in the barrier 6, and resultantly the electron energy (eV) is higher in wells 7 than in the barriers 6. The effectively lower height for barriers 6 moves the transition energy to lower wavelengths and aligns the first excited state to the top of the barrier 6.

Referring now to FIG. 5, an exemplary responsivity profile is shown for a detector 1 without blocking layer 12 composed of group III-V nitrides having a GaN/InGaN multiple quantum well 5. Infrared response curves were measured using a FTIR system. Responsivity was calculated using a geometrical factor of ten corresponding to a solid angle of $0.2\pi$ and flux covering the detector 1 in a full and uniform fashion. In practice, the incident light covered an area wider than the active area of the detector 1 so that actual responsivity may be a factor of 2 higher.

In FIG. 5, the photocurrent response is shown for 10 mV, 30 mV, and 50 mV under normal incidence. Several observations are noteworthy. The termination of spectra at 22 μm is an artifact of the KRS window. Peak responses are seen at 2.0 μm, 12.5 μm, 14 μm and 20 μm. The spike at 8 μm is attributed to noise. The level response at 13.5 μm is due to LO-phonon absorptions in GaN. The absence of a response around 16–17 μm may be due to TO-phonon absorptions in GAN or a significant decrease of the absorption from sub-band levels. The drop-off at 12 μm is attributed to the first interference minima corresponding to 2 (n)(d), where n is the refractive index and d is the overall GaN film thickness.

The selection rule prohibits optical absorption for normally incident light by a quantum well. However, detectors 1 described in FIGS. 1 and 2 were responsive to infrared light at normal and oblique incidences. While not intending to be bound by theory, several explanations are possible. It is possible that an inhomogeneous distribution of indium within the quantum well alters the translational symmetry along quantum well directions so that dipole terms in x and y directions are no longer zero. It is also possible that quantum boxes are embedded within the quantum wells and responsive to normally incident light.

Referring now to FIG. 6, an exemplary responsivity profile is shown for a detector 1 without blocking layer 12 composed of group III-V nitrides having a GaN/InGaN multiple quantum well 5. Spectral measurements were taken for the detector 1 mounted at normal incidence with a white polyethylene FIR window having an OPD of 0.05 cm/s. The threshold wavelength of the detector 1 is approximately 65 μm for a forward bias of 0.1V. A threshold wavelength for a reverse bias voltage was not obtained, since response peaks were observed around 68 μm and 88 μm. A responsivity as high as 350 mW/A was observed under reverse bias. Responsivity is not symmetric with respect to the bias, eight times higher at reverse bias than at forward bias, indicating the presence of a built-in electric field.

Signal peaks at 2 μm and 8–12 μm were observed at forward and reverse bias. The responsivity peak at 2 μm is believed to result from a donor-to-continuum transition or a defect-to-continuum transition in the InGaN wells 7. Peaks in the range of 8 to 12 μm are attributed to a bound-to-bound transition in the multiple quantum well 5. Identified peaks beyond 20 μm are signals rather than noise as they are nearly identical in forward and reverse bias. Furthermore, interference is unlikely because the sapphire substrate 2 is non-transparent beyond 7 μm. These peaks may arise from bound to continuum transitions.

The description above indicates that a great degree of flexibility is offered in terms of the present invention. Although the present invention has been described in considerable detail with reference to certain preferred versions thereof, other versions are possible. Therefore, the spirit and scope of the appended claims should not be limited to the description of the preferred versions contained herein.

INDUSTRIAL APPLICABILITY

As is evident from the above explanation, the described invention provides low noise, high resolution and operability, and high pixel uniformity. The robustness of the invention improves image quality achieved by and range of focal plane arrays composed of group III-V nitride elements.

Accordingly, the described invention is expected to be utilized as detectors in focal plane arrays for night vision, navigation, weather monitoring, security, surveillance, defense systems, and chemical and biological detection.

What is claimed is:

1. A quantum-well infrared photodetector comprising:
   (a) a buffer layer;
   (b) a first conducting layer contacting said buffer layer;
   (c) a multiple quantum well capable of absorption at normal and oblique incidences comprising a plurality of barriers and a plurality of wells in an alternating layered fashion, one of said plurality of barriers contacting said first conducting layer opposite of said buffer layer, said barriers having an electron concentration less than said wells and band gap energies higher than said wells, said multiple quantum well having a translation symmetry so that dipole terms are not zero or a plurality of quantum boxes responsive to normal incident light; and
   (d) a second conducting layer contacting said multiple quantum well opposite of said first conducting layer wherein said buffer layer, said first conducting layer, said barriers, said wells, and said second conducting layer are composed of group III-V nitrides.

2. The quantum-well infrared photodetector of claim 1, wherein said first conducting layer and said second conducting layer are doped to have an elevated electron concentration.

3. The quantum-well infrared photodetector of claim 1, wherein said wells are doped to have an elevated electron concentration.

4. The quantum-well infrared photodetector of claim 1, further comprising:
   (e) a substrate contacting said buffer layer opposite of said first conducting layer.

5. The quantum-well infrared photodetector of claim 4, wherein said substrate is a monocrystal oxide, a monocrystal carbide, or a binary group III-V nitride.

6. The quantum-well infrared photodetector of claim 1, wherein said buffer layer is a binary composition, a ternary composition or a quaternary composition.

7. The quantum-well infrared photodetector of claim 1, wherein said first conducting layer and said second conducting layer are a binary composition, a ternary composition or a quaternary composition.

8. The quantum-well infrared photodetector of claim 1, wherein said wells and said barriers are composed of a binary composition, a ternary composition, or a quaternary composition.

9. A focal plane array capable of absorption at normal and oblique incidences comprising a plurality of quantum-well infrared photodetectors as in claim 1.

10. A quantum-well infrared photodetector comprising:
    (a) a buffer layer;
    (b) a first conducting layer contacting said buffer layer;
    (c) a multiple quantum well capable of absorption at normal and oblique incidences comprising a plurality of barriers and a plurality of wells in an alternating layered fashion, one of said plurality of barriers contacting said first conducting layer opposite of said buffer layer, said barriers having an electron concentration less than said wells and band gap energies higher than said wells, said multiple quantum well having a translation symmetry so that dipole terms are not zero or a plurality of quantum boxes responsive to normal incident light;

(d) a blocking layer contacting said multiple quantum well opposite of said first conducting layer; and (e) a second conducting layer contacting said blocking layer opposite of said multiple quantum well, wherein said buffer layer, said first conducting layer, said barriers, said wells, said blocking layer, and said second conducting layer are composed of group III-V nitrides.

11. The quantum-well infrared photodetector of claim 10, wherein said first conducting layer and said second conducting layer are doped to have an elevated electron concentration.

12. The quantum-well infrared photodetector of claim 10, wherein said wells are doped to have an elevated electron concentration.

13. The quantum-well infrared photodetector in claim 10, wherein said blocking layer has a reduced electron concentration.

14. The quantum-well infrared photodetector of claim 10, further comprising:

(f) a substrate contacting said buffer layer opposite of said first conducting layer.

15. The quantum-well infrared photodetector of claim 14, wherein said substrate is a monocrystal oxide, a monocrystal carbide, or a binary group III-V nitride.

16. The quantum-well infrared photodetector of claim 10, wherein said buffer layer is a binary composite, a ternary composition or a quaternary composition.

17. The quantum-well infrared photodetector of claim 10, wherein said first conducting layer and said second conducting layer are a binary composition, a ternary composition or a quaternary composition.

18. The quantum-well infrared photodetector of claim 10, wherein said wells and said barriers are composed of a binary composition, a ternary composition, or a quaternary composition.

19. The quantum-well infrared photodetector of claim 10, wherein said blocking layer is a binary composition, a ternary composition or a quaternary composition.

20. A focal plane array capable of absorption at normal and oblique incidences comprising a plurality of quantum-well infrared photodetectors as in claim 10.

* * * * *